(12) United States Patent
Tailliet

(10) Patent No.: US 8,891,310 B2
(45) Date of Patent: Nov. 18, 2014

(54) EEPROM MEMORY PROTECTED AGAINST BREAKDOWN OF CONTROL GATE TRANSISTORS

(75) Inventor: Francois Tailliet, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 188 days.

(21) Appl. No.: 13/610,425

(22) Filed: Sep. 11, 2012

(65) Prior Publication Data
US 2013/0064014 A1 Mar. 14, 2013

(30) Foreign Application Priority Data
Sep. 12, 2011 (FR) ...................................... 11 58094

(51) Int. Cl.
G11C 11/34 (2006.01)
G11C 16/04 (2006.01)
G11C 16/08 (2006.01)

(52) U.S. Cl.
CPC ............ *G11C 16/0425* (2013.01); *G11C 16/08* (2013.01)
USPC ............ 365/185.18; 365/185.05; 365/185.26; 365/189.05

(58) Field of Classification Search
USPC ............. 365/185.05, 185.18, 185.23, 189.05, 365/185.26
See application file for complete search history.

(56) References Cited

U.S. PATENT DOCUMENTS

| 5,608,676 A | * | 3/1997 | Medlock et al. ......... 365/189.09 |
| 6,222,774 B1 | | 4/2001 | Tanzawa et al. |
| 6,934,188 B2 | * | 8/2005 | Roohparvar ............. 365/185.18 |
| 6,934,192 B2 | | 8/2005 | Tailliet et al. |
| 7,319,630 B2 | * | 1/2008 | Wang et al. .................... 365/226 |
| 7,839,682 B2 | * | 11/2010 | Tran et al. ................ 365/185.05 |
| 2008/0019179 A1 | | 1/2008 | Nakamura et al. |
| 2010/0110791 A1 | | 5/2010 | Tailliet |

* cited by examiner

*Primary Examiner* — Son Dinh
(74) *Attorney, Agent, or Firm* — Seed IP Law Group PLLC

(57) ABSTRACT

The disclosure relates to an electrically erasable and programmable memory comprising at least one word of memory cells with first and second control gate transistors in parallel to apply a control gate voltage to the memory cells of the word. The memory also comprises s first control circuit to supply a first control voltage to a control terminal of the first control gate transistor through a first current limiter, and a second control circuit to supply a second control voltage to a control terminal of the second control gate transistor through second current limiter.

20 Claims, 4 Drawing Sheets

US 8,891,310 B2

EEPROM MEMORY PROTECTED AGAINST BREAKDOWN OF CONTROL GATE TRANSISTORS

BACKGROUND

1. Technical Field

The present disclosure relates to an electrically erasable and programmable (EEPROM) memory and to a method for programming and erasing the memory.

2. Description of the Related Art

In conventional EEPROM memories, memory cells are grouped in words of fixed length, for example 8, 16, or 32 bits. Each word comprises a corresponding number of memory cells, which are collectively erasable and individually programmable.

FIG. 1 shows the structure of a word $W_{i,k}$ in a conventional EEPROM memory array MA0. The word $W_{i,k}$ comprises J memory cells MC and a control gate transistor $CT_{i,k}$. Each memory cell comprises a select transistor ST and a floating gate transistor FGT. The select transistor ST has a drain D connected to a bitline $BL_j$, a gate G connected to a first wordline $WL1_i$, and a source S connected to a drain D of the floating gate transistor. The floating gate transistor FGT has a gate G connected to a control gate line $GL_{i,k}$, and a source S connected to a source line $SL_i$. The control gate transistor $CT_{i,k}$ has a drain D connected to a column select line $CL_k$, and a source S connected to the control gate line $GL_{i,k}$.

Erasing or programming of memory cells is performed by injecting or extracting electrical charges in or from the floating gate of the floating gate transistors FGT by tunnel effect, also known as the Fowler Nordheim effect. To this end, a high voltage Vpp is applied to the gate of the transistors FGT through the control gate transistor $CT_{i,k}$ or to the drain of the transistors FGT through the select transistor ST.

It is known from U.S. Pat. No. 6,934,192, which is incorporated by reference herein in its entirety, that the select transistor ST of a memory cell may suffer from a gate oxide breakdown due to deficiencies of the manufacturing process and/or an erase/program stress. It has been demonstrated that such breakdown may not only prevent erase, program, and read operations from being performed on the defective memory cell, but may also prevent other memory cells from being correctly erased or programmed. The above-mentioned patent brings to light and addresses this problem by providing a second wordline $WL2_i$ to which the gate of the control gate transistor $CT_{i,k}$ is connected. This allows the voltage applied to the gates of the select transistors ST through the first wordline $WL1_i$ to be different from the voltage applied to the control gate transistor $CT_{i,k}$ through the second wordline $WL2_i$. The above-mentioned patent also proposes to limit the current flowing through a bitline $BL_j$ connected to a select transistor ST with a gate oxide breakdown.

BRIEF SUMMARY

The present disclosure includes the observation that the control gate transistors $CT_{i,k}$ may also experience, though less frequently, gate oxide breakdown. Such a breakdown may cause a short-circuit between the gate and the channel (formed between the source and drain), between the gate and the source, or between the gate and the drain of the transistor, and have an adverse effect on the erasure or programming of memory cells. To illustrate, it is assumed that the control gate transistor $CT_{i,k}$ shown in FIG. 1 has a gate oxide breakdown. Two cases can be considered, respectively during an erase operation and during a program operation.

First, it is assumed that a word (not shown) connected to wordlines $WL1_i$, $WL2_i$ is being erased, while word $W_{i,k}$ is not to be erased. The second wordline $WL2_i$ is set to high voltage Vpp. The first wordline $WL1_i$ is set to zero or a very low voltage. The source line $SL_i$ is grounded. The column select line $CL_k$ is grounded or set to the floating state.

If the column select line is set to the floating state, and assuming that the control gate transistor $CT_{i,k}$ has a gate-source short-circuit, the source S of transistor $CT_{i,k}$ undesirably rises to voltage Vpp and voltage Vpp is applied to the gates G of the floating gate transistors FGT of word $W_{i,k}$. As a result, the memory cells of word $W_{i,k}$ may be unintentionally erased since the source line $SL_i$ is grounded.

If the column select line is grounded, and assuming that the control gate transistor $CT_{i,k}$ has a gate-drain short-circuit, a short-circuit occurs between voltage Vpp on the gate of transistor $CT_{i,k}$ and the ground applied to the drain D of transistor $CT_{i,k}$. Voltage Vpp is generally generated by a voltage booster circuit, for example a charge pump, from a power supply voltage Vcc of the memory. Such a booster circuit is generally not designed to withstand a short-circuit for the duration of an erase or program operation. As a result, voltage Vpp collapses and the erasure process cannot be performed on the memory cells.

Second, it is assumed that one or more memory cells MC of word $W_{i,k}$ are being programmed. Voltage Vpp is applied to the first wordline $WL1_i$ and to bitlines $BL_j$ connected to the memory cells to be programmed. The column select line $CL_k$ is grounded. A voltage Von is applied to the second wordline $WL2_i$ to set the control gate transistor $CT_{i,k}$ in the conducting state, for the application of the ground potential to the gates of the floating gate transistors. The gate oxide breakdown of transistor $CT_{i,k}$ creates a short-circuit between voltage Von on wordline $WL2_i$ and the ground on the column select line $CL_k$. As a result, voltage Von collapses and the memory cells MC cannot be programmed.

It may therefore be desired to provide an EEPROM memory protected against the effects of a gate oxide breakdown of a control gate transistor.

Embodiments of the disclosure relate to an electrically erasable and programmable memory comprising at least one word of memory cells comprising each a floating gate transistor, a first control gate transistor for applying a control gate voltage to the floating gate transistors of the memory cells, a second control gate transistor in parallel with the first control gate transistor, for applying the control gate voltage to the floating gate transistor, first control means configured to supply a first control voltage to a control terminal of the first control gate transistor through first current limiting means, and second control means configured to supply a second control voltage to a control terminal of the second control gate transistor through second current limiting means.

According to one embodiment, the first and second control gate transistors are arranged in parallel between an output of a row decoder and the floating gate transistors, the first control gate transistor has a control terminal driven by a first output of a column latch, and the second control gate transistor has a control terminal driven by a second output of the column latch.

According to one embodiment, the first and second current limiting means are arranged in the column latch and configured to limit a current flowing through the first output in case of breakdown of the first control gate transistor, and to limit current flowing through the second output in case of breakdown of the second control gate transistor.

According to one embodiment, the first and second control gate transistors are arranged in parallel between an output of a column latch and the floating gate transistors, the first control gate transistor has a control terminal driven by a first output of a row decoder, and the second control gate transistor has a control terminal driven by a second output of the row decoder.

According to one embodiment, the first and second current limiting means are arranged in the row decoder and configured to limit a current flowing through the first output in case of breakdown of the first control gate transistor, and to limit a current flowing through the second output in case of breakdown of the second control gate transistor.

According to one embodiment, each memory cell further comprises a select transistor having a control terminal not linked to the control terminals of the control gate transistors of the word.

According to one embodiment, the memory further comprises program latches comprising current limiting means to individually apply a program voltage to the floating gate transistors of the memory cells of the word.

Embodiments of the disclosure also relate to an electronic device comprising an electrically erasable memory according to the disclosure.

Embodiments of the disclosure also relate to a method for erasing and programming memory cells in at least one word of an electrically erasable and programmable memory, each memory cell comprising a floating gate transistor, the memory further comprising a first control gate transistor for applying a control gate voltage to the floating gate transistors of the memory cells of the word, wherein the method comprises the steps of supplying a second control gate transistor in parallel with the first control gate transistor, applying the control gate voltage to the floating gate transistor through the first and second control gate transistors, supplying a first control voltage to a control terminal of the first control gate transistor, supplying a second control voltage to a control terminal of the second control gate transistor, limiting a current flowing through the control terminal of the first control gate transistor in case of breakdown of the first control gate transistor, and limiting a current flowing through the control terminal of the second control gate transistor in case of breakdown of the second control gate transistor.

According to one embodiment, the method further comprises arranging the first and second control gate transistors in parallel between an output of a row decoder and the floating gate transistors, and supplying the first and second control voltages through first and second outputs of a column latch.

According to one embodiment, the method comprises providing first and second current limiting means in the column latch, to limit the first or the second current in case of breakdown of the first or second control gate transistors.

According to one embodiment, the method further comprises arranging the first and second control gate transistors in parallel between an output of a column latch and the floating gate transistors, and supplying the first and second control voltages through first and second outputs of a row decoder.

According to one embodiment, the method further comprises providing first and second current limiting means in the row decoder, to limit the first or the second current in case of breakdown of the first or second control gate transistors.

According to one embodiment, the method further comprises providing a select transistor in each memory cell, and not linking a control terminal of the select transistor to the control terminals of the control gate transistors of the word.

BRIEF DESCRIPTION OF THE SEVERAL VIEWS OF THE DRAWINGS

Embodiments of the present disclosure will now be described in connection with, but not limited to, the appended drawings in which.

DETAILED DESCRIPTION

Figure 2:
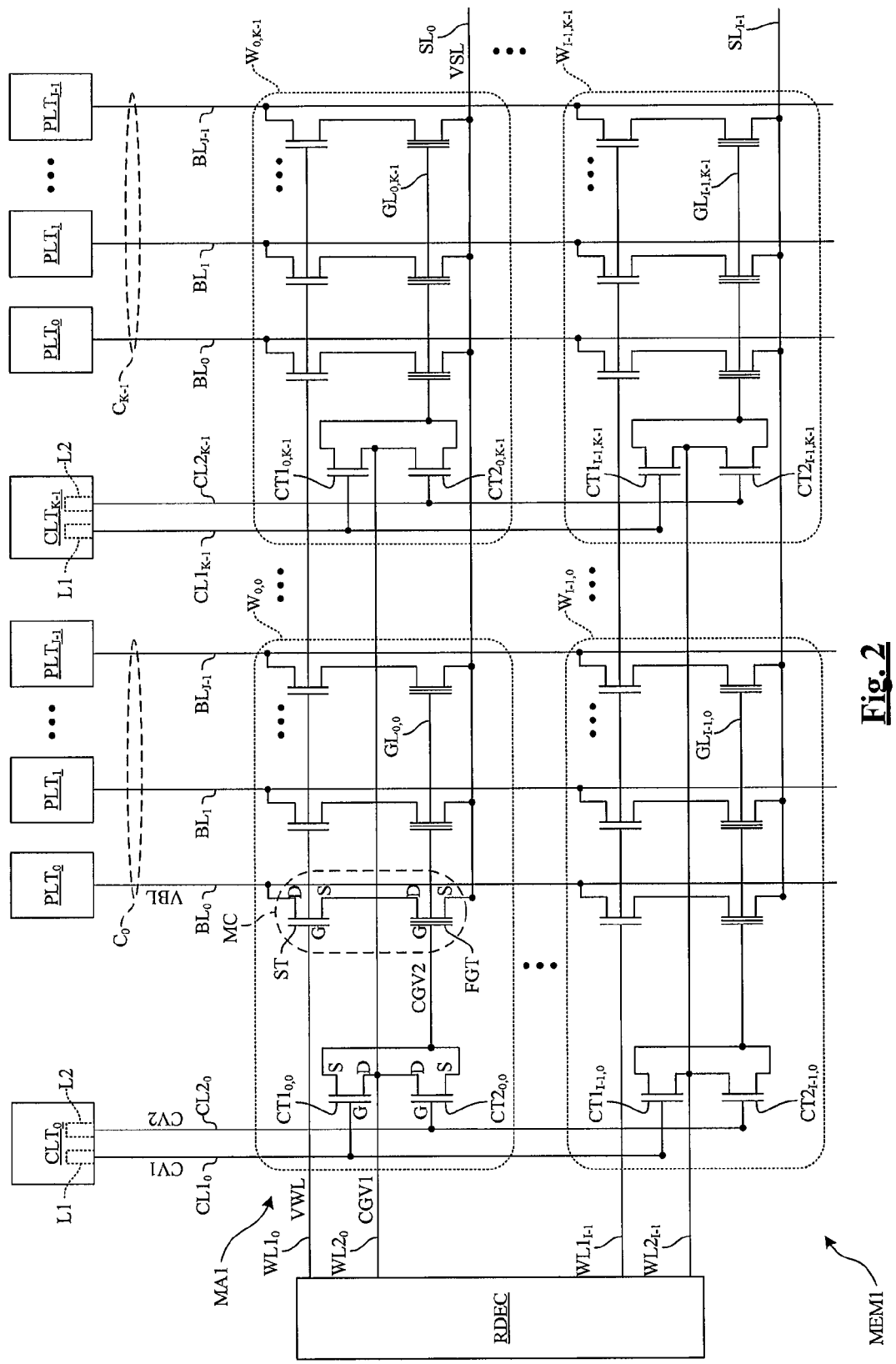
FIG. 2 shows an EEPROM memory according to one embodiment of the disclosure.

FIG. 2 shows a memory MEM1 according to one embodiment of the disclosure. Memory MEM1 comprises a memory array MA1 which comprises: I×K words $W_{i,k}$ ($W_{0,0}$ . . . $W_{0,K-1}$, . . . , $W_{I-1,0}$ . . . $W_{I-1,K-1}$), each comprising J memory cells MC, a first control gate transistor $CT1_{i,k}$ and a second control gate transistor $CT_{i,k}$ of the same type of conductivity, here NMOS transistors; K groups of J bitlines $BL_j$ ($BL_0$ to $BL_{J-1}$), each group forming a column $C_k$ ($C_0$ to $C_{K-1}$); I first wordlines $WL1_i$ ($WL1_0$ to $WL1_{I-1}$); I second wordlines $WL2_i$ ($WL2_0$ to $WL2_{I-1}$); I source lines $SL_i$ ($SL_0$ to $SL_{I-1}$); I×K control gate lines $GL_{i,k}$ ($GL_{0,0}$ to $GL_{0,K-1}$, . . . , $GL_{I-1,0}$ to $GL_{I-1,K-1}$), i.e., one per word; I×K first control gate transistors $CT1_{i,k}$, i.e., one per word $W_{i,k}$; I×K second control gate transistors $CT2_{i,k}$, i.e., one per word $W_{i,k}$; K first column select lines $CL1_k$, i.e., one per column $C_k$; and K second column select lines $CL2_k$, i.e., one per column $C_k$.

A word $W_{i,k}$ is connected to the bitlines $BL_j$ ($BL_0$ to $BL_{J-1}$) of a column $C_k$, first and a second wordlines $WL1_i$, $WL2_i$, first and a second column select lines $CL1_k$, $CL2_k$, and a source line $SL_i$. Each memory cell MC of a word $W_{i,k}$ comprises a select transistor ST and a floating gate transistor FGT. The select transistor ST has a drain D connected to a bitline $BL_j$, a gate G connected to the first wordline $WL1_i$, and a source S connected to a drain D of the floating gate transistor FGT. The floating gate transistor FGT has a gate G connected to a control gate line $GL_{i,k}$, and a source S connected to the source line $SL_i$.

The first control gate transistor $CT1_{i,k}$ has a source connected to the control gate line $GL_{i,k}$, a drain connected to the second wordline $WL2_i$, and a gate connected to the first column select lines $CL1_k$. The second control gate transistor $CT2_{i,k}$ has a source connected to the control gate line $GL_{i,k}$, a drain connected to the second wordline $WL2_i$, and a gate connected to the second column select line $CL2_k$. Thus, the control gate transistors $CT1_{i,k}$, $CT2_{i,k}$ are arranged in parallel between second wordline $WL2_i$ and the control gate line $GL_{i,k}$.

To summarize, a word $W_{i,k}$ of memory array MA1 differs from a conventional memory word in that it comprises two control gate transistors $CT1_{i,k}$ $CT2_{i,k}$ in parallel, having their gates controlled through two different column select lines $CL1_k$, $CL2_k$.

Memory MEM1 also comprises a row decoder RDEC, K column latches $CLT_k$ ($CLT_0$ to $CLT_{K-1}$), i.e., one per column $C_k$, K groups of J program latches $PLT_j$ ($PLT_0$ to $PLT_{J-1}$), i.e., one group per column $C_k$, and one program latch $PLT_j$ per bitline $BL_j$. The row decoder RDEC has I first outputs to drive the first wordlines $WL1_i$ and I second outputs to drive the second wordlines $WL2_i$. Each program latch $PLT_j$ has an output connected to a bitline $BL_j$, and the different source lines $SL_i$ may be linked to ground through source select transistors (not shown).

Each column latch $CLT_k$ has a first output connected to a first column select line $CL1_k$, and a second output connected to a second column select line $CL2_k$. These outputs supply control voltages CV1, CV2 to the gates of control gate transistors $CT1_{i,k}$, $CT2_{i,k}$ through the first and second column select lines $CL1_k$, $CL2_k$. Voltages CV1, CV2 are approximately equal during normal operation, and differ only in the case of gate oxide breakdown. Voltages CV1, CV2 may be equal to a high erase or program voltage Vpp or to a voltage Von, as it will be seen later in greater detail.

According to an aspect of this embodiment of the disclosure, each column latch comprises two current limiters L1, L2 to limit a current supplied by their outputs on the column select lines $CL1_k$, $CL2_k$. Therefore, if one of the control voltages CV1 or CV2 supplied by the column latch is short-circuited to ground due to a gate oxide breakdown of a control gate transistor connected to the corresponding column select lines $CL1_k$, $CL2_k$, the short-circuit current will be limited by the current limiter L1 or L2 to a level well below the current capability of the voltage source generating the voltage Vpp or Von (preferably at least one order of magnitude less). Consequently, the voltage source supplying voltage Vpp or Von will not collapse, and the control voltage CV2 or CV1 will continue to be supplied by the output which is not short-circuited of the column latch.

Therefore, thanks to the provision of dual control gate transistors and current limiters in the circuit that applies the control voltages to the gates of these transistors, here a column latch, a gate-drain short circuit in one of these transistors will not prevent the other transistor from receiving the control voltage.

The skilled person will note that the expression "will not collapse" does not necessarily mean that the voltage Vpp or Von is not affected to some extent by the short-circuit. In practice, providing a current limitation does not necessarily guarantee that the initial Vpp or Von level will be maintained. However, the remaining Vpp or Von level is sufficient to perform the operation in the process of being performed.

These advantages will now be described in greater detail by analyzing different cases in which the effects of a failure of a control gate transistor is neutralized by the present disclosure.

Table 1 below describes the voltages applied to the wordlines, column select lines, and bitlines, and their values when erase and program operations are performed. Such voltages depend on whether the considered word $W_{i,k}$ is selected or not. In table 1, VWL designates a voltage applied to first wordlines $WL1_i$. VSL designates a voltage applied to source lines $SL_i$. VBL designates a voltage applied to bitlines BLj. VCG1 designates a control gate voltage applied to the drains of control gate transistors through second wordlines $WL2_i$. VCG2 designates the control gate voltage applied to control gates of floating gate transistors through control gate transistors $CT1_{i,k}$, $CT2_{i,k}$. Vpp is a high voltage for erase or program operation, for example 14 to 17 V. Von is a voltage supplied to the gate of a control gate transistor to set the transistor in a conducting state. Von may be equal to voltage Vpp or to a power supply voltage Vcc of the memory, and generally speaking any voltage value that sets the transistor in the conducting state. The symbol "#" represents a floating state and "0" is the ground potential.

For the sake of simplicity, it is assumed that all the transistors are "perfect switches" with no threshold value and that the voltage on a first conducting terminal of a transistor is equal to the voltage on its second conducting terminal. In particular, it is assumed that control gate voltage CGV1 applied to the drain of a control gate transistor is equal to control gate voltage CGV2 supplied by the source of the control gate transistor when the transistor is in the conducting state. In practice, it is within the knowledge of the skilled person to provide slightly increased voltages on the drains of the transistors if NMOS transistors are used, or reciprocally on the sources of the transistors if PMOS transistors are used, to obtain the desired value on the other conducting terminal, source or drain, of the transistors.

TABLE 1

| | | ERASE | | PROGRAM | |
|---|---|---|---|---|---|
| Line | Voltage | Selected | Not Sel. | Selected | Not Sel. |
| Bitline $BL_j$ | VBL | # | # | Vpp | # |
| Source line $SL_i$ | VSL | 0 | # | # | # |
| Wordline $WL1_i$ | VWL | 0 | 0 | Vpp | 0 |
| Wordline WL2i | CGV1 | Vpp | 0 | 0 | 0 |
| Column select line $CL1_k$ | CV1 | Vpp | 0 | Von | 0 |
| Column select line $CL2_k$ | CV2 | Vpp | 0 | Von | 0 |
| Control gate line $GL_{i,k}$ | CGV2 | Vpp | # | 0 | # |

In the following cases, it will be assumed that control gate transistor $CT2_{0,0}$ of word $W_{0,0}$ has a gate oxide breakdown and that control gate transistor $CT1_{0,0}$ is not faulty.

Case 1: Erasure of Word $W_{0,0}$

The gates and drains of transistors $CT1_{0,0}$, $CT2_{0,0}$ receive voltage Vpp (CV1=CV2=Vpp, CGV1=Vpp). Transistor $CT1_{0,0}$ is in the conducting state and supplies voltage Vpp to the control gates of the floating gate transistors. The gate oxide breakdown of transistor $CT2_{0,0}$, whether or not the transistor is still conducting, does not cause a Vpp-ground short circuit and does not prevent voltage Vpp from being applied to the control gates of the floating gate transistors through transistor $CT1_{0,0}$. Consequently, the floating gate transistors FGT of word $W_{0,0}$ are correctly erased.

Case 2: Programming of Word $W_{0,0}$

The gates of transistors $CT1_{0,0}$, $CT2_{0,0}$ initially receive voltage Von (CV1=CV2=Von). The drains of transistors $CT1_{0,0}$, $CT2_{0,0}$ are grounded (CGV1=0). Von is short-circuited to ground across transistor $CT2_{0,0}$ (CV2=0 instead of CV2=Von) but continues to be supplied to the gate of transistor $CT1_{0,0}$ (CV1=Von) thanks to the short-circuit current limitation and for reasons explained above. Consequently, transistor $CT2_{0,0}$ is OFF (non-conducting) but transistor $CT2_{0,0}$ is ON (conducting), and voltage CGV1 (here the ground potential) is applied to the control gates of the floating gate transistors. Those which receive the Vpp voltage on their drain are thus correctly programmed.

Case 3: Erasure of a Word $W_{0,k}$ Connected to the Same Wordline as Word $W_{0,0}$, While Word $W_{0,0}$ is not Erased (i.e., not Selected)

The gates of transistors $CT1_{0,0}$, $CT2_{0,0}$ are grounded (CV1=CV2=0) since column $C_0$ is not selected. The drains of transistors $CT1_{0,0}$, $CT2_{0,0}$ receive voltage Vpp (CGV1=Vpp) since word $W_{0,k}$ connected to wordlines $WL1_0$, $WL2_0$ is to be erased. Even if $CT2_{0,0}$ has a gate oxide breakdown, no channel is created in the transistor as its gate is grounded. Therefore, no gate-source short-circuit is created and the gate oxide breakdown does not prevent the other word from being erased.

Case 4: Programming of a Word $W_{0,k}$ Connected to the Same Wordline as Word $W_{0,0}$, While Word $W_{0,0}$ is not Programmed (i.e., not Selected)

The gates of transistors $CT1_{0,0}$, $CT2_{0,0}$ are grounded (CV1=CV2=0) since column $C_0$ is not selected. The drains of transistors $CT1_{0,0}$, $CT2_{0,0}$ are grounded (CGV1=0) since word $W_{0,k}$ connected to wordlines $WL1_0$, $WL2_0$ must be programmed. Even if transistor $CT2_{0,0}$ has a gate oxide breakdown, there is no gate-source short-circuit created in the transistor since its gate and drain are grounded. The memory cells of word $W_{0,k}$ are therefore correctly programmed.

Case 5: Erasure of a Word $W_{i,0}$ of the Same Column as Word $W_{0,0}$, While Word $W_{0,0}$ is not Erased The gates of transistors $CT1_{0,0}$, $CT2_{0,0}$ receive voltage Vpp (CV1=CV2=Vpp) since column $C_0$ is selected for the erasure of word $W_{i,0}$ (for example word $W_{I-1,0}$). The drains of transistors $CT1_{0,0}$, $CT2_{0,0}$ are grounded (CGV1=0) since the wordline $WL2_{0,0}$ is not selected. Voltage Vpp is short-circuited to ground across transistor $CT2_{0,0}$ and the voltage collapses on column select line $CL2_0$. However, voltage Vpp continues to be supplied on column select line $CL1_0$ by column latch CLT0 thanks to the short-circuit current limitation and for reasons explained above. Consequently, the first control gate transistor $CT1_{i,0}$ of word $W_{i,0}$ continues to receive voltage Vpp on its gate through column select line $CL1_0$, and supplies it to the floating gate transistors of the word, which are correctly erased.

Case 6: Programming of a Word $W_{i,0}$ of the Same Column as Word $W_{0,0}$, While Word $W_{0,0}$ is not Programmed The gates of transistors $CT1_{0,0}$, $CT2_{0,0}$ receive voltage Von (CV1=CV2=Von) since column $C_0$ is selected for the programming of the other word $W_{i,0}$ (for example word $W_{I-1,0}$). The drains of transistors $CT1_{0,0}$, $CT2_{0,0}$ are grounded (CGV1=0) since the wordline $WL2_{0,0}$ is not selected. Voltage Von is short-circuited to ground across transistor $CT2_{0,0}$ and collapses on column select line $CL2_0$. Voltage Von continues to be supplied however on column select line $CL1_0$ by column latch $CLT_0$ thanks to the short-circuit current limitation and for reasons explained above. Consequently, the first control gate transistor $CT1_{i,0}$ of the other word $W_{i,0}$ continues to receive voltage Von on its gate through column select line $CL1_0$, and supplies it to the floating gate transistor of the word. The floating gate transistors that receive voltage Vpp on their drain are thus correctly erased.

Figure 1:
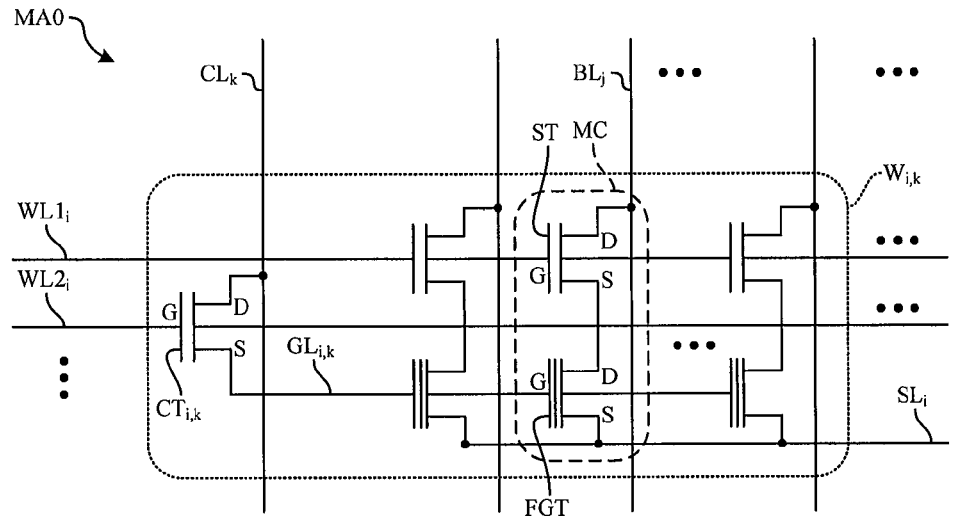
FIG. 1, previously described, shows a conventional word structure in an EEPROM memory array.
Figure 3:
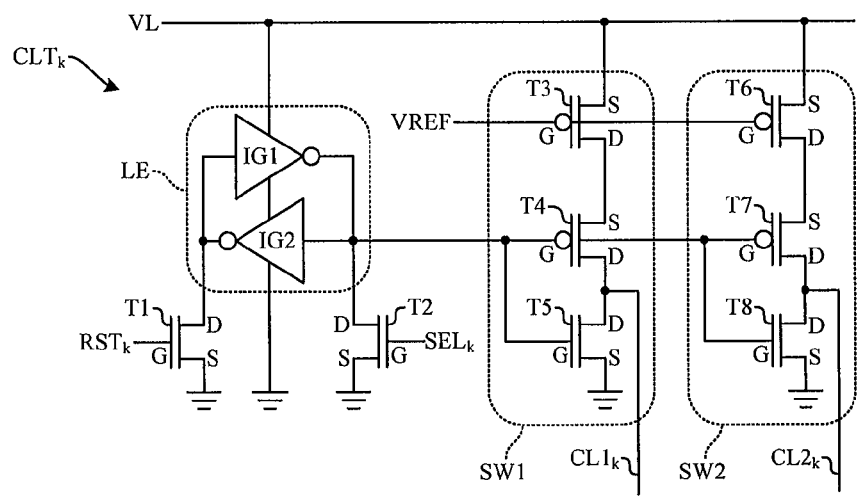
FIG. 3 shows a column latch according to one embodiment of the disclosure.

FIG. 3 shows an example embodiment of a column latch $CLT_k$. Column latch $CLT_k$ comprises a locking element LE and two switches SW1, SW2 controlled by the locking element. The switches SW1, SW2 implement the current limiters L1, L2, respectively. The locking element LE comprises two inverting gates IG1, IG2 connected head-to-tail. The input of inverting gate IG1 is linked to ground through an NMOS transistor T1 whose gate receives a column reset signal $RST_k$. The input of inverting gate IG2 is linked to ground through an NMOS transistor T2 whose gate receives a column select signal $SEL_k$.

Switch SW1 comprises three transistors T3, T4, T5 in series. Transistors T3, T4 are PMOS transistors and transistor T5 is an NMOS transistor. Transistor T3 has its source connected to a voltage line VL and its drain connected to the source of transistor T4. Transistor T4 has its drain connected to the drain of transistor T5 whose source is connected to ground. Likewise, switch SW2 comprises three transistors T6, T7, T8 in series, transistors T6, T7 being PMOS transistors and transistor T8 being an NMOS transistor. Transistor T6 has its source connected to the voltage line VL and its drain connected to the source of transistor T7. Transistor T7 has its drain connected to the drain of transistor T8 whose source is connected to ground. The gates of transistors T4, T5, T7, T8 are connected to the output of inverting gate IG1. The drains of transistors T4, T5 form a first output of latch $CLT_k$ and are connected to a column select line $CL1_k$. The drains of transistors T7, T8 form a second output of latch $CLT_k$ and are connected to a column select line $CL2_k$. The gates of transistors T3, T6 receive a reference voltage VREF which is supplied for example by a current mirror (not shown).

When the latch $CLT_k$ has been reset by the reset signal $RST_k$, the output of inverting gate IG1 is high. Transistors T5, T8 are conducting and link the column select lines $CL1_k$, $CL2_k$ to ground. When the latch $CLT_k$ has been activated by the select signal $SEL_k$, the output of inverting gate IG1 is grounded. Transistors T5, T8 are OFF, transistors T4, T7 are ON and the column select lines $CL1_k$, $CL2_k$ are linked to the voltage line VL through transistors T3, T4 and transistors T6, T7, respectively. The outputs of the latch $CLT_k$ supply the voltage Vpp or the voltage Von according to the voltage applied to the voltage line VL. If a short-circuit occurs on one of the column select lines $CL1_k$, $CL2_k$, transistors T3 or T6 limit the current in the faulty column select line, thereby preventing a collapse of a voltage source linked to line VL. Therefore, and as indicated above, the other output of latch $CLT_k$ continues to supply the voltage Vpp or Von to the non-faulty column select line.

Figure 4:
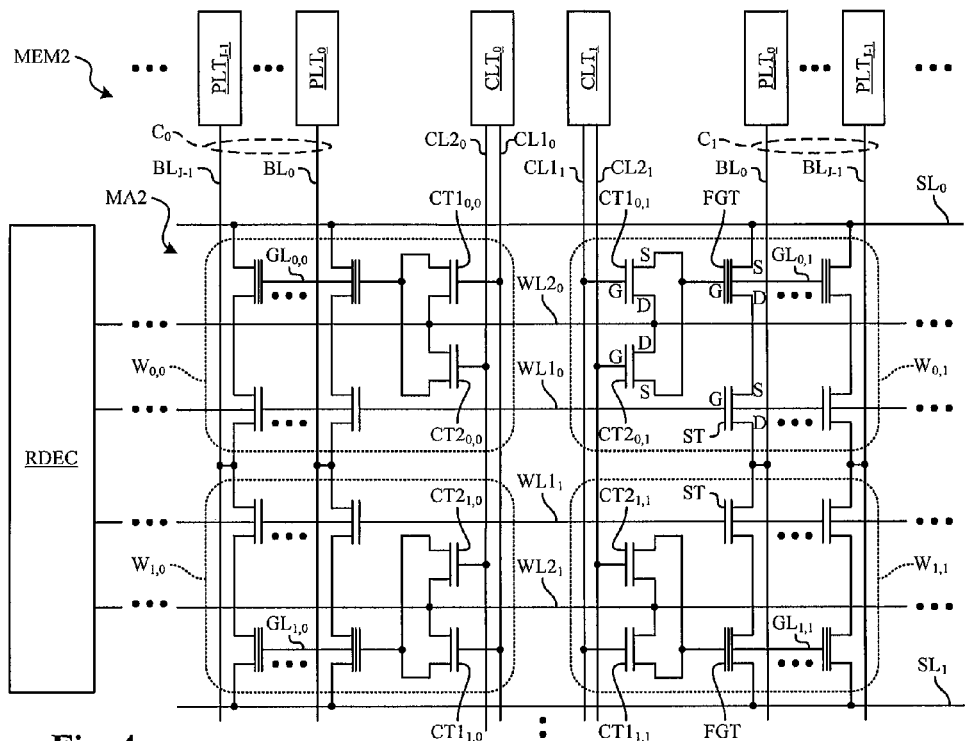
FIG. 4 shows an EEPROM memory according to another embodiment of the disclosure.

FIG. 4 shows an embodiment of a memory MEM2 according to the disclosure which is functionally identical to memory MEM1 previously described in that it comprises the same transistors and the same elements (decoder, latches) as memory MEM1, which will not be described again. Memory MEM2 has a memory array MA2 which only differs from memory array MA1 in that pairs of columns of memory cells and pairs of rows of memory cells present a vertical or respectively horizontal axis of symmetry. For example, the column select lines $CL1_0$, $CL2_0$ and $CL1_1$, $CL2_1$ of columns $C_0$, $C_1$ are arranged next to each other and both columns present a vertical axis of symmetry. The select transistors ST of the memory cells connected to wordline $WL_{1,0}$ and the select transistors ST of the memory cells connected to wordline $WL_{1,1}$ are arranged next to each other and both rows of memory cells present a horizontal axis of symmetry. Such a structure is generally known as a "folded" memory array structure.

Figure 5:
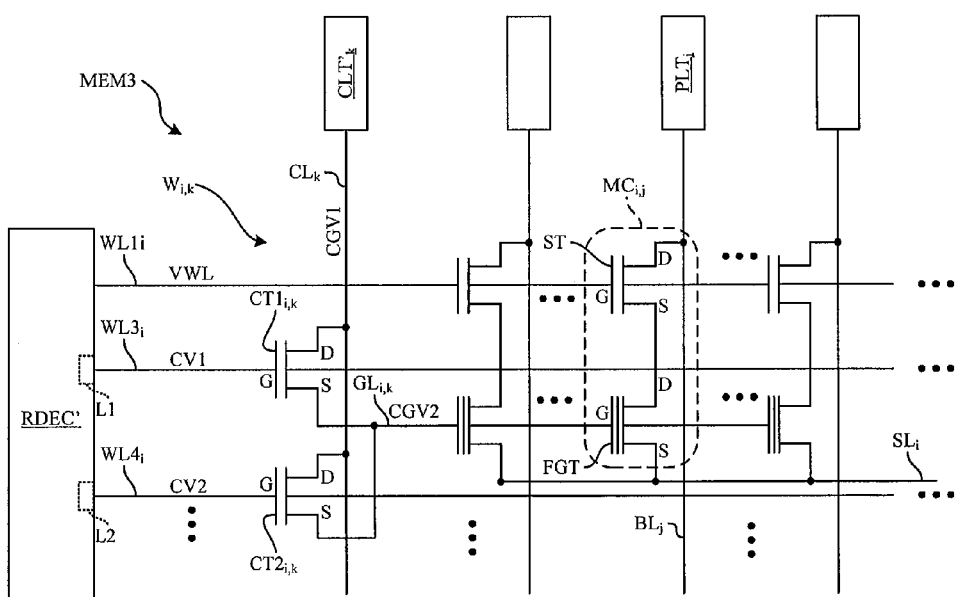
FIG. 5 shows an EEPROM memory according to another embodiment of the disclosure.

FIG. 5 shows another embodiment of a memory MEM3 according to the disclosure in which the structure of the words $W_{i,k}$ is identical to that of memory MEM1. For the sake of simplicity, only one word is shown. Memory MEM3 differs from memory MEM1 in that the control voltages CV1, CV2 applied to the gate of the control gate transistors $CT1_{i,k}$, $CT2_{i,k}$ of the words $W_{i,k}$ are supplied by a row decoder RDEC', whereas the control gate voltage CGV1 is supplied by a column select latch $CLT'_k$. The row decoder RDEC' therefore comprises three outputs per row of memory cells. For each row, the first output drives the gates of the select transistors of the row through wordline $WL1_i$ and supplies voltage VWL. The second output drives the gates of the first control gate transistors $CT1_{i,k}$ of the words of the row through a wordline $WL3_i$ and supplies voltage CV1. The third output drives the gates of the second control gate transistors $CT2_{i,k}$ of the words of the row through a wordline $WL4_i$ and supplies voltage CV2. The second and third outputs of the row decoder include the current limiters L1, L2 that were previously present in the column latch $CLT_k$ of memory MEM1. The previously described voltage combinations, intervening in the erase or program operations, are unchanged except the fact that voltages CV1, CV2, CGV1 are supplied by different elements from that of memory MEM1.

Figure 6:
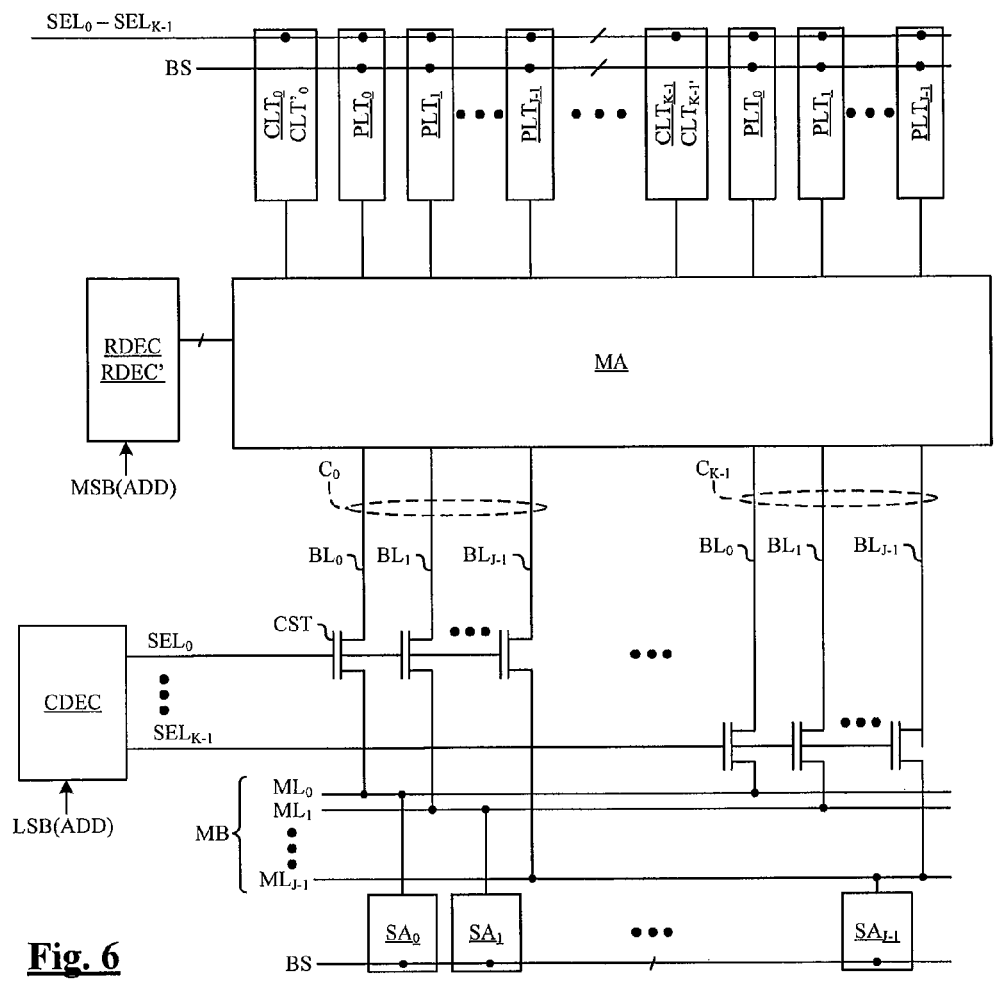
FIG. 6 shows some elements of an EEPROM memory according to the disclosure which are not shown in FIGS. 2, 4, 5.

FIG. 6 shows elements of a memory according to the disclosure that are not shown in FIGS. 2, 4, 5. The memory shown in this figure may be any of memories MEM1 to MEM3 and has a memory array MA shown in block form that may be any of the memory arrays of memories MEM1 to MEM3. It can be seen that the memory also comprises a column decoder CDEC, J×K column select transistors CST, i.e., one per bitline, a multiplexing bus MB with J multiplexing lines $ML_j$ ($ML_0$ to $M_{J-1}$), i.e., one per bit of a word, and J sense amplifiers $SA_j$ ($SA_0$ to $SA_{J-1}$).

Each bitline $BL_j$ of each column $C_k$ is linked to a multiplexing line $ML_j$ of the same rank through a column select transistor CST. Each multiplexing line $ML_j$ is connected to an input of a sense amplifier $SA_j$ of the same rank. Each sense amplifier $SA_j$ has an output connected to a wire of a data bus BS, and provides a bit read in a memory cell during the reading of a word. The column decoder CDEC supplies K column select signal $SEL_k$ ($SEL_0$ to $SEL_K$). Each column select signal is applied to the gates of the column select transistors CST linked to the bitlines of a column $C_k$ of the same rank, as well as to the column select latch $CLT_k$ of the same rank and the program latches $PLT_j$ belonging to the column of the same rank. The program latches $PLT_j$ are further linked to the data bus BS to receive data bits to be programmed in the memory. The row decoder RDEC or REDC' receives the most significant bits MSB of an address ADD of a word to be erased, programmed or read, and the column decoder CDEC receives the least significant bits LSB of the address ADD.

Figure 7:
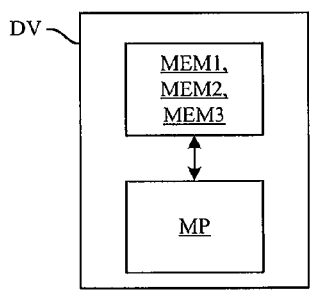
FIG. 7 shows a device comprising a memory according to the disclosure.

FIG. 7 shows an electronic device DV comprising a memory MEM1, MEM2, or MEM3 according to the disclosure. The device further comprises, for example, a microprocessor MP linked to the memory.

It will be understood by the skilled person that the disclosure is susceptible of various different implementations. For example, instead of the two column select lines $CL1_k$, $CL2_k$ being linked to same column latch $CLT_k$, they may be linked to separate latches, each latch being controlled by the same select and reset signals.

In an alternative embodiment of memory array MA1 shown in FIG. 2, the control gate transistors $CT1_{i,k}$, $CT2_{i,k}$ may be connected to different word lines instead of being connected of the same word line $WL2_i$.

Furthermore, the program latches $PLT_j$ may also comprise current-limiting means to provide protection against gate oxide breakdown of select transistors ST, as disclosed in U.S. Pat. No. 6,934,192. Other current limiting means may also be provided in the row decoder RDEC, to drive wordlines $WL1_i$.

Finally, it will be understood by the skilled person that the separate word/select line structure as disclosed by U.S. Pat. No. 6,934,192 may not be essential to some embodiments of the disclosure. In particular, the gates of the select transistors ST of a horizontal row of memory cells and the drains of the control gate transistors $CT1_{i,k}$, $CT2_{i,k}$ of the same row may be linked to the same wordline. In this case, additional means may be provided for linking control gate line $GL_{i,k}$ to ground when the word is to be programmed. To this end, an additional transistor controlled by the column latch $CLT_k$ may be provided in each word to link the gate line $GL_{i,k}$ to ground during program operations.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrically erasable and programmable memory comprising:
    a word of memory cells each including a floating gate transistor;
    a first control gate transistor configured to apply a control gate voltage to the floating gate transistors of the memory cells of the word;
    a second control gate transistor in parallel with the first control gate transistor and of a same conductivity type as the first control gate transistor, and configured to also apply the control gate voltage to the floating gate transistors of the word; and
    a control circuit configured to supply a first control voltage to a control terminal of the first control gate transistor and a second control voltage to a control terminal of the second control gate transistor, the control circuit including:
        a first current limiter electrically coupled to the control terminal of the first control gate transistor and configured to limit current drawn through the first control gate transistor, and
        a second current limiter electrically coupled to the control terminal of the second control gate transistor and configured to limit current drawn through the second control gate transistor.

2. A memory according to claim 1, comprising:
a row decoder having an output, wherein:
    the first and second control gate transistors are arranged in parallel between the output of the row decoder and the floating gate transistors,
    the control circuit includes a column latch having first and second outputs configured to drive the control terminals of the first and second control gate transistors, respectively.

3. A memory according to claim 2, wherein:
the column latch includes the first and second current limiters;
the first current limiter is configured to limit a current flowing through the first output in case of breakdown of the first control gate transistor; and
the second current limiter is configured to limit current flowing through the second output in case of breakdown of the second control gate transistor.

4. A memory according to claim 1, wherein:
the first and second control gate transistors are arranged in parallel between an output of a column latch and the floating gate transistors,
the control circuit includes a row decoder having a first output configured to drive the control terminal of the first control gate transistor and a second output configured to drive the control terminal of the second control gate transistor.

5. A memory according to claim 4, wherein:
the row decoder includes the first and second current limiters;
the first current limiter is configured to limit a current flowing through the first output in case of breakdown of the first control gate transistor, and
the second current limiter is configured to limit a current flowing through the second output in case of breakdown of the second control gate transistor.

6. A memory according to claim 1, wherein each memory cell further comprises a select transistor having a control terminal not electrically coupled to the control terminals of the control gate transistors of the word.

7. A memory according to claim 1, further comprising program latches configured to individually apply respective program voltages to the floating gate transistors of the memory cells of the word, each program latch including an additional current limiter.

8. An electronic device comprising:
a processor; and
an electrically erasable memory coupled to the processor and including:
- a word of memory cells each including a floating gate transistor;
- a first control gate transistor configured to apply a control gate voltage to the floating gate transistors of the memory cells of the word;
- a second control gate transistor in parallel with the first control gate transistor and of a same conductivity type as the first control gate transistor, and configured to also apply the control gate voltage to the floating gate transistors of the word; and
- a control circuit configured to supply a first control voltage to a control terminal of the first control gate transistor and a second control voltage to a control terminal of the second control gate transistor, the control circuit including:
  - a first current limiter electrically coupled to the control terminal of the first control gate transistor and configured to limit current drawn through the first control gate transistor, and
  - a second current limiter electrically coupled to the control terminal of the second control gate transistor and configured to limit current drawn through the second control gate transistor.

9. A device according to claim 8, wherein:
the memory includes a row decoder having an output,
the first and second control gate transistors are arranged in parallel between the output of the row decoder and the floating gate transistors, and
the control circuit includes a column latch having first and second outputs configured to drive the control terminals of the first and second control gate transistors, respectively.

10. A device according to claim 9, wherein:
the column latch includes the first and second current limiters;
the first current limiter is configured to limit a current flowing through the first output in case of breakdown of the first control gate transistor; and
the second current limiter is configured to limit current flowing through the second output in case of breakdown of the second control gate transistor.

11. A device according to claim 8, wherein:
the first and second control gate transistors are arranged in parallel between an output of a column latch and the floating gate transistors,
the control circuit includes a row decoder having a first output configured to drive the control terminal of the first control gate transistor and a second output configured to drive the control terminal of the second control gate transistor.

12. A device according to claim 11, wherein:
the row decoder includes the first and second current limiters;
the first current limiter is configured to limit a current flowing through the first output in case of breakdown of the first control gate transistor, and
the second current limiter is configured to limit a current flowing through the second output in case of breakdown of the second control gate transistor.

13. A device according to claim 8, wherein each memory cell further comprises a select transistor having a control terminal not electrically coupled to the control terminals of the control gate transistors of the word.

14. A device according to claim 8, wherein the memory includes program latches configured to individually apply respective program voltages to the floating gate transistors of the memory cells of the word, each program latch including an additional current limiter.

15. A method comprising:
supplying a first control voltage to a control terminal of a first control gate transistor;
supplying a second control voltage to a control terminal of a second control gate transistor in parallel with the first control gate transistor and of a same conductivity type as the first control gate transistor;
applying a control gate voltage to a floating gate transistor through the first and second control gate transistors, the floating gate transistor being part of a memory cell of a memory word of an electrically erasable and programmable memory;
limiting a first current flowing through the control terminal of the first control gate transistor in case of breakdown of the first control gate transistor; and
limiting a second current flowing through the control terminal of the second control gate transistor in case of breakdown of the second control gate transistor.

16. A method according to claim 15, wherein:
supplying the first control voltage includes supplying the first control voltage through a first output of a column latch; and
supplying the second control voltage includes supplying the second control voltage through a second output of the column latch, the first and second control gate transistors being in parallel between an output of a row decoder and the floating gate transistor.

17. A method according to claim 16, wherein:
limiting the first current includes using a first current limiter in the column latch to limit the first current in case of breakdown of the first control gate transistor; and
limiting the second current includes using a second current limiter in the column latch to limit the second current in case of breakdown of the second control gate transistor.

18. A method according to claim 15, further comprising:
supplying the first control voltage includes supplying the first control voltage through a first output of a row decoder; and
supplying the second control voltage includes supplying the second control voltage through a second output of the row decoder, the first and second control gate transistors being coupled in parallel between an output of column latch and the floating gate transistor.

19. A method according to claim 18, wherein:
limiting the first current includes using a first current limiter in the row decoder to limit the first current in case of breakdown of the first control gate transistor; and
limiting the second current includes using a second current limiter in the row decoder to limit the second current in case of breakdown of the second control gate transistor.

20. A method according to claim 15, further comprising:
accessing the memory cell by:
activating a first word line coupled to a control terminal of a select transistor of memory cell, the control terminal of the select transistor not being electrically coupled to the control terminals of the control gate transistors of the word; and activating a second wordline coupled to drain terminals of the control gate transistors.

* * * * *